United States Patent
Marshall

[11] Patent Number: 6,157,214
[45] Date of Patent: Dec. 5, 2000

[54] WIRING OF CELLS IN LOGIC ARRAYS

[75] Inventor: Alan Marshall, Bristol, United Kingdom

[73] Assignee: Hewlett-Packard Company, Fort Collins, Colo.

[21] Appl. No.: 09/347,222

[22] Filed: Jul. 2, 1999

[30] Foreign Application Priority Data

Jul. 6, 1998 [EP] European Pat. Off. ............... 98305369

[51] Int. Cl.[7] .................................................. H03K 19/177
[52] U.S. Cl. ................................................. 326/41; 326/47
[58] Field of Search ................... 326/41, 45, 47

[56] References Cited

U.S. PATENT DOCUMENTS

| | | | |
|---|---|---|---|
| 5,367,209 | 11/1994 | Hauck et al. | 326/45 |
| 5,448,186 | 9/1995 | Kawata | 326/41 |
| 5,801,546 | 9/1998 | Pierce et al. | 326/41 |

FOREIGN PATENT DOCUMENTS

| | | |
|---|---|---|
| 0463746A2 | 5/1991 | European Pat. Off. . |
| 0746104A1 | 5/1996 | European Pat. Off. . |

OTHER PUBLICATIONS

European Search Report, EP 98 30 5369, Dec. 1, 1998.

*Primary Examiner*—Tan T. Nguyen

[57] ABSTRACT

A programmable logic device, such as a field programmable gate array or arithmetic array, comprises: a rectilinear array of logic cells 10 pitched with first and second general cell pitches $P_1$, $P_2$, respectively, in first and second axial directions, respectively, of the array; a first array of wires 12 each extending generally in the first direction between a respective pair of the cells which have a pitch of $N_1 \times P_1$, where $N_1$ is an integer greater than one, the first wire array having a pitch in the second direction generally equal to $N_2 \times P_2$, where $N_2$ is an integer greater than zero; and a second array of wires 14 each extending generally in the second direction between a respective pair of the cells which have a pitch of $N_1 \times P_2$, the second wire array having a pitch in the second direction generally equal to $N_2 \times P_1$. In order to minimize the number of cell locations with respect to the wiring to which each cell is connected, the wires in the first array have offsets in the first direction which are a first function of their position in the second direction, and the wires in the second array have offsets in the second direction which are a second function of their position in the first direction.

17 Claims, 9 Drawing Sheets

Length-8 Wires
Horizontal Wire Offset (3, 1) or (-5, 1)
Vertical Wire Offset (1, 3) or (1, -5)

Length-8 Horizontal Wires
Aligned

Length-8 Horizontal & Vertical Wires
Aligned

FIG. 3

Length-8 & Length-16 Wires Aligned

FIG. 4

Length-8 Wires
Horizontal Wire Offset (3, 1) or (-5, 1)
Vertical Wire Offset (1, 3) or (1, -5)

Length-10 Wires
Horizontal Wire Offset (3, 1) or (-7, 1)
Vertical Wire Offset (-1, 3) or (-1, -7)

TOTAL 14

FIG. 7

TOTAL 7

WIRING OF CELLS IN LOGIC ARRAYS

This invention relates to a programmable logic device, such a field programmable gate array (FPGA) or field programmable arithmetic array (FPAA).

More particularly, a first aspect of the present invention, relates to a programmable logic device, comprising: a rectilinear array of logic cells pitched with first and second general cell pitches $P_1$, $P_2$, respectively, in first and second axial directions, respectively, of the array; and an array of "long" wires each extending generally in the first direction between a respective pair of the cells which have a pitch of $N_1 \times P_1$, where $N_1$ is an integer greater than one, the wire array having a pitch in the second direction generally equal to $N_2 \times P_2$, where $N_2$ is an integer greater than zero.

Such a device is known in which the long wires are aligned in the second direction. It has been realised that such alignment places restrictions on the placement of hard macros on the device (i.e. macros with specified placements and specified physical wires and switches to be used) as will be described in more detail later.

In order to reduce the severity of this restriction, the logic device of the first aspect of the invention is characterised in that pairs of the wires of the array which are adjacent in the second direction are mutually offset in the first direction. (Although this feature is applied to the array of wires in question, the array may be interleaved with other wires which do not possess this feature.) Preferably, all, or the majority, of the adjacent pairs of the wires are generally evenly offset by a distance $D \times P_1$.

The invention is particularly advantageous when applied to "long" wires of the device for which $N_1$ is greater than two, and more preferably is a power-of-two, preferably greater than four. The value D is preferably greater than one so as to avoid an excessive diagonal bias to the device.

The invention is particularly advantageous when applied to a device which includes a second array of wires each extending generally in the second direction between a respective pair of the cells which have a pitch of $N_3 \times P_2$, where $N_3$ is an integer greater than one, the second wire array having a pitch in the first direction generally equal to $N_4 \times P_1$, where $N_4$ is an integer greater than zero, and pairs of the wires of the second array which are adjacent in the first direction being mutually offset in the second direction. In this case, it is preferable that: $N_1=N_3$; $N_2=N_4$; and the values D for the first-mentioned and second arrays are generally equal.

In one class of embodiments of the invention, $(D^2-1)$ mod $(N_1/N_2)=0$, where "mod" represents the modulus operation. In this case, the cells at the ends of the wires may be arranged so that they possess reflective symmetry about a diagonal of the cell array.

In another class of embodiments of the invention, $(D^2+1)$ mod $(N_1/N_2)=0$. In this case, the cells at the ends of the wires may be arranged so that they possess quarter-turn rotational symmetry.

The device may further include a third array of wires each extending generally in the first direction between a respective pair of the cells which have a pitch of $2^M \times N_1 \times P_1$, where M is an integer greater than zero, the third wire array having a pitch in the second direction generally equal to $2^M \times N_2 \times P_2$, and pairs of the wires of the third array which are adjacent in the second direction being mutually offset in the first direction. At least one other such wire array may also be provided based on a different power-of-two, $2^M$.

The device may further include a fourth array of wires each extending generally in the second direction between a

2 respective pair of the cells which have a pitch of $2^M \times N_3 \times P_2$, the fourth wire array having a pitch in the first direction generally equal to $2^M \times N_4 \times P_1$, and pairs of the wires of the fourth array which are adjacent in the first direction being mutually offset in the second direction. Again, at least one other such wire array may also be provided based on a different power-of-two, $2^M$.

In order to tackle the problem of the restriction on the placement of hard macros mentioned above, in accordance with a second aspect of the present invention, there is provided a programmable logic device, comprising: a rectilinear array of logic cells pitched with first and second general cell pitches $P_1$, $P_2$, respectively, in first and second axial directions, respectively, of the array; a first array of wires each extending generally in the first direction between a respective pair of the cells which have a pitch of $N_1 \times P_1$, where $N_1$ is an integer greater than one, the first wire array having a pitch in the second direction generally equal to $N_2 \times P_2$, where $N_2$ is an integer greater than zero; and a second array of wires each extending generally in the second direction between a respective pair of the cells which have a pitch of $N_1 \times P_2$, the second wire array having a pitch in the second direction generally equal to $N_2 \times P_1$; characterised in that: the wires in the first array have offsets in the first direction dependent upon their position in the second direction, and the wires in the second array have offsets in the second direction dependent upon their position in the first direction. Preferably, the wires in the first array have offsets in the first direction which are a first function (in the strict mathematical sense of the word) of their position in the second direction, and the wires in the second array have offsets in the second direction which are a second function of their position in the first direction. The first and second functions may be the same, or may be the same but with opposite signs.

Specific embodiments of the present invention will now be described, purely by way of example, with reference to the accompanying drawings, in which.

Each of FIGS. 1 to 8 shows a 17×17 square array of cells 10, which is part of a larger array of cells making up the device. The cells are assumed to have a horizontal pitch of one unit, and a vertical pitch of one unit, and a Cartesian coordinate system is marked on each of the drawings. However, the horizontal and vertical cell pitches need not be equal. Also, the axes of the array need not be orthogonal. Furthermore, the cell pitch in either direction need not be constant. For example, the cells in either direction could have alternating pitches to allow more space for wiring in alternate channels between the cells 10.

Although not shown in the drawings, each of the cells 10 is connected by "short" wires to each of its four or eight neighbouring cells. Additionally, it is common practice in the design of FPGA ICs to provide "long" wires, wires that are longer than the dimensions of a single cell (where the cell is the repeated unit of logic circuitry). Such long wires are generally an integral multiple of the cell dimension, where the multiplier is a power of 2. The drawings show long wires 12,14,16,18,24,26 interconnecting series of cells where the two cells at the end of each series have a pitch of at least 2 units. The wiring is shown as extending across the cells 10. Additionally or alternately, the wiring could be disposed in the channels between the cells. All of the drawings show each length of wiring as being connected to all of the cells which it crosses. In some circumstances, each length of wiring might be connected to only some of the cells it crosses. (It should be noted that the terms "wire" and "wiring" as used in this specification are not to be interpreted as having a limited meaning of a conductor which has been produced by a traditional wire-drawing process.)

Each of the cells 10 includes one or more arithmetic logic units (ALUs), and/or one or more logic gates, and/or one or more switches and/or one or more memory cells for storing a program for the ALU(s) and/or to set the gate(s) and/or for use as user memory. In the following detailed description, it is assumed that all of the logic cells are identical. However, they may differ, for example in dependence on the wires to which they are connected.

It is common practice in designing circuits for implementation of FPGAs to use pre-designed blocks of circuitry to save design time. If such a block is specified as a netlist of functional units without any placement of the units or use of physical wires being specified, then the block is called a "soft macro". If the block is specified as a netlist of functional units complete with specified placements and specified physical wires and switches to be used, then the block is called a "hard macro". This concept will be referred to again later.

Figure 1:
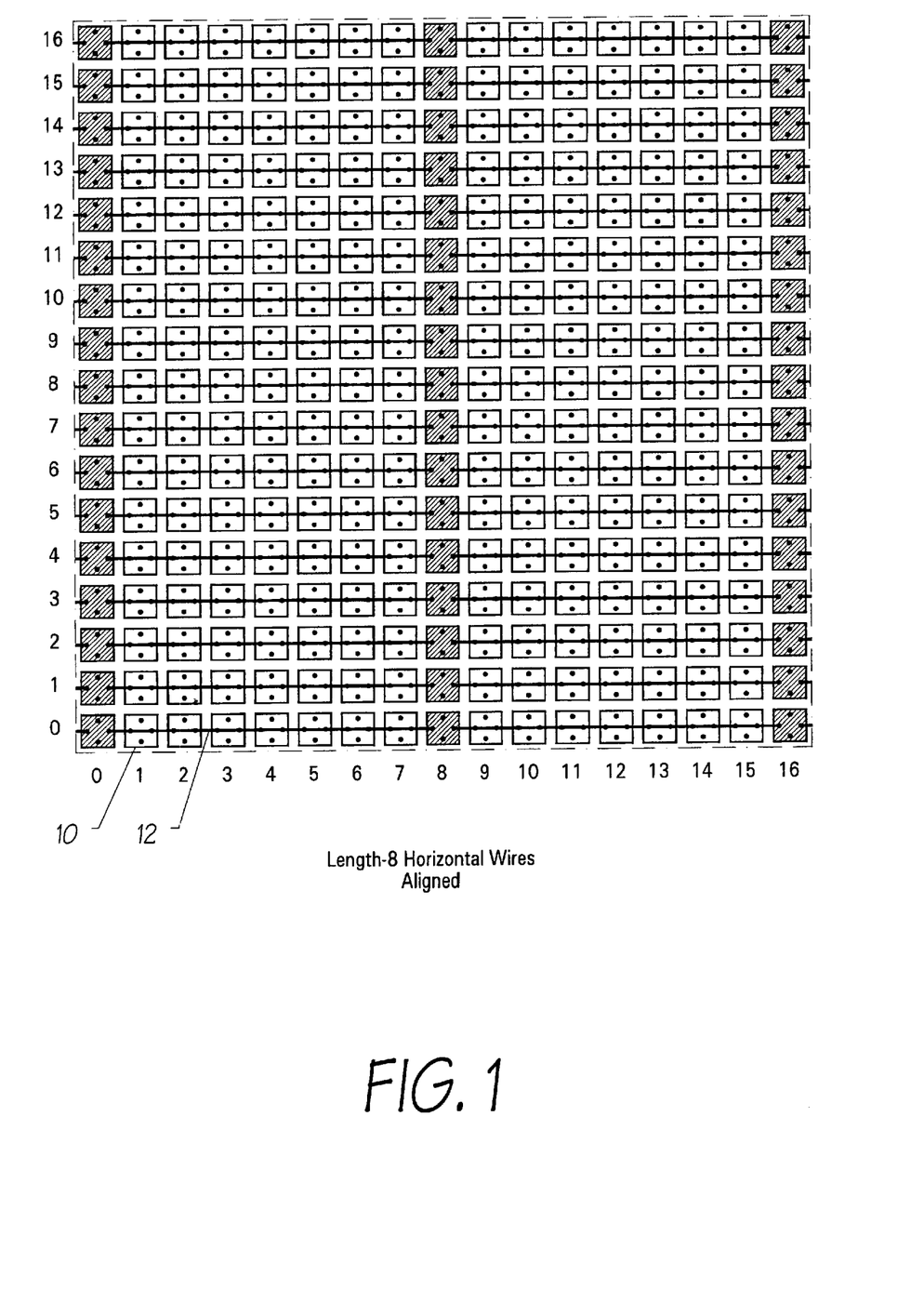
FIGS. 1 and 2 show horizontal and vertical layers, respectively, of the wiring of a device which is not in accordance with the present invention.
Figure 2:
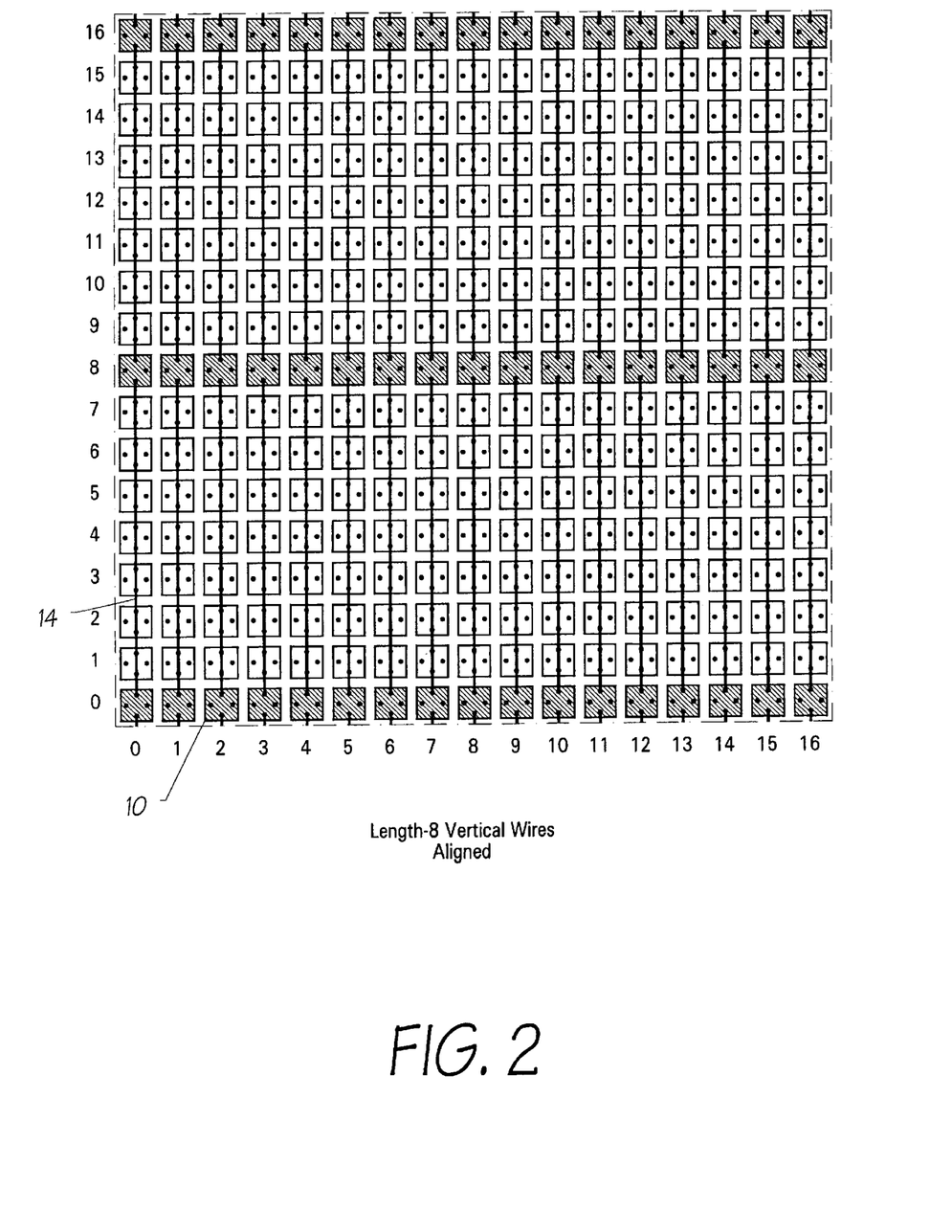
Figure 3:
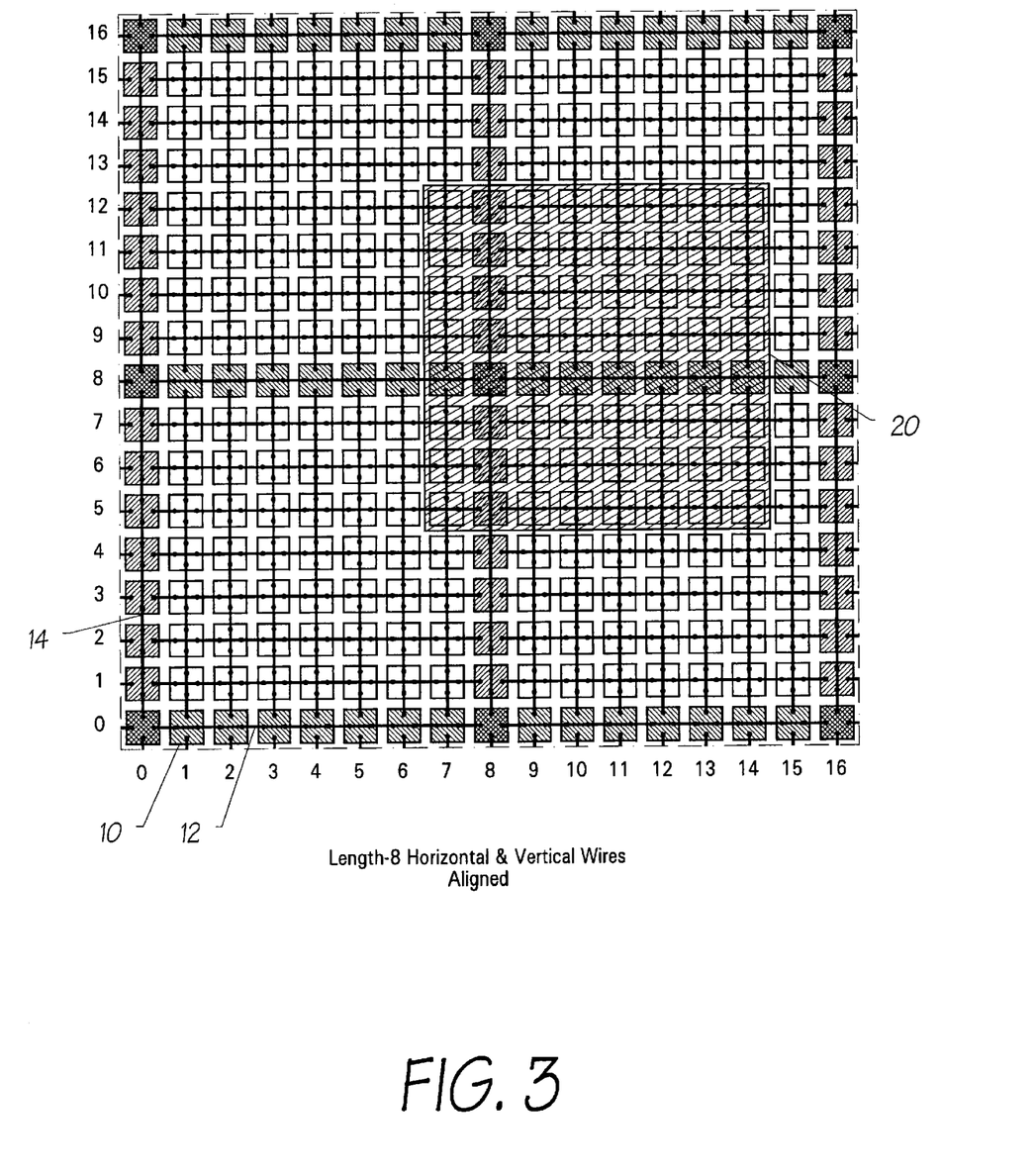
FIG. 3 shows the wiring layers of FIGS. 1 and 2 superimposed.

FIG. 1 shows a horizontal layer of wiring, where each of the wires 12 extends between and is connected to a pair of the cells 10 having a pitch of L times the basic cell pitch and is also connected to the L−1 cells in between. Specifically, in FIG. 1, L=8, and accordingly the wires will be referred to as length-8 wires. FIG. 2 shows a vertical layer of wiring, where each of the wires 14 extends between and is connected to a pair of the cells 10 having a pitch of L times the basic cell pitch and is also connected to the L−1 cells in between. Again, in FIG. 2, L=8. FIG. 3 shows the two layers of wiring of FIGS. 1 and 2 superimposed on each other.

Clearly the positions of the L cells along a horizontal long wire are all distinct, in that these cells all have different positions with respect to the horizontal length-L wire passing by them. Similarly, the positions of the L cells along a vertical long wire are all distinct, in that these cells all have different positions with respect to the vertical length-L wire passing by them.

In FIG. 3, the end points of the length-8 wires are aligned in both the horizontal and vertical directions. However, such an arrangement makes all $L^2$=64 positions within any repeated tile of length-L wires (such as that bounded by the hatched square 20) distinct. This is a disadvantage when the user of the FPGA wishes to place a hard macro that uses length L wires on the FPGA, as the hard macro can only be placed at one position in each repeated tile of length L wires if it is to connect to the length L wires as intended, because points that are equivalent with respect to the horizontal wires differ with respect to the vertical wires, and vice versa. Thus, in the example, only one in every sixty-four positions is suitable for placing the hard macro.

Figure 4:
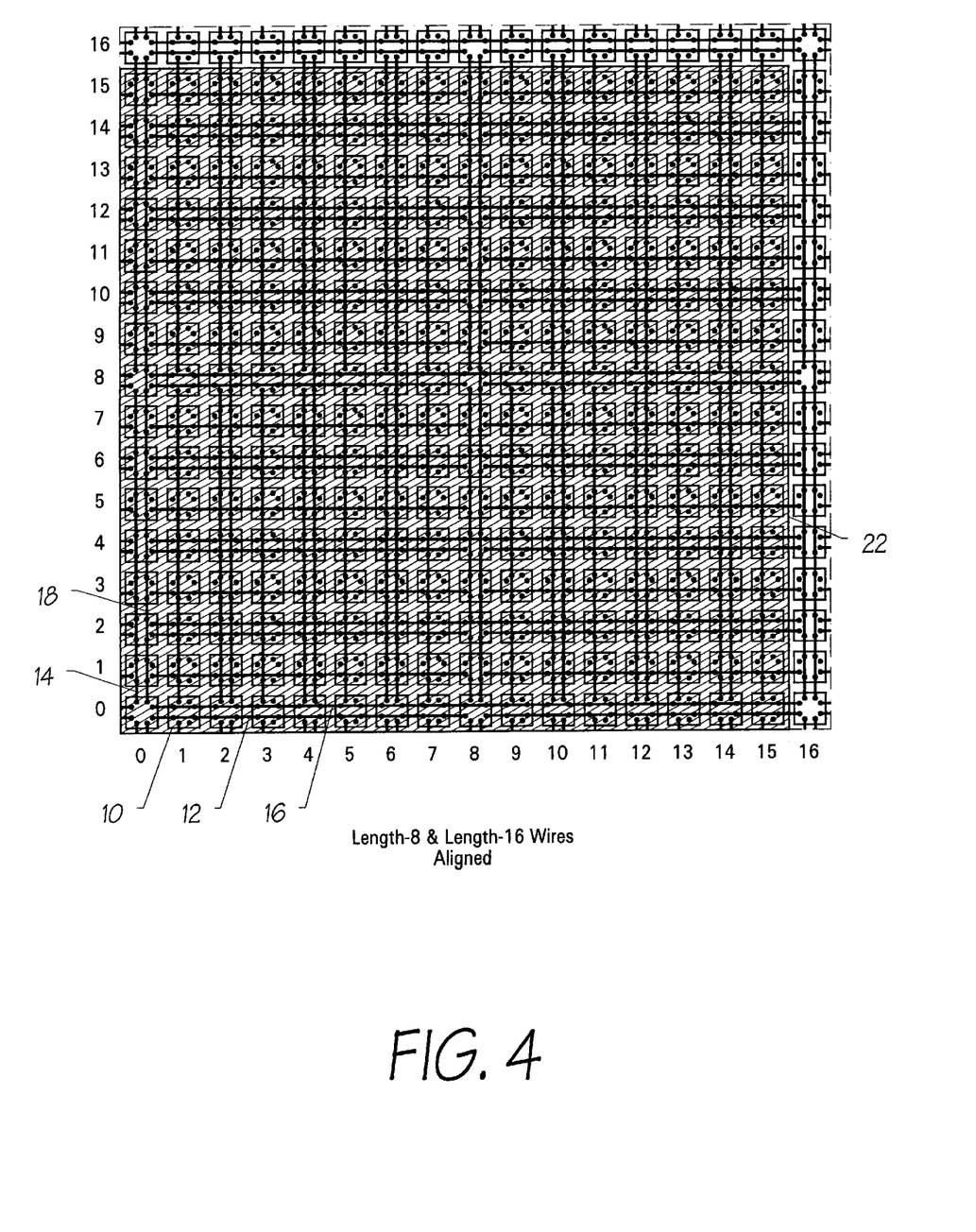
FIG. 4 shows horizontal and vertical layers of the wiring of another device which is a development of that shown in FIG. 3 and which is not in accordance with the present invention.

It is common practice for there to be long wires of various lengths, in which case the wires of each length are separately arranged, and a set of shorter wires is typically placed so that the ends of some of the shorter wires align with the ends of longer ones. An example of this is shown in FIG. 4, which is similar to FIG. 3, but with horizontal length-16 wires provided for every other row of the array, and vertical length-16 wires provided for every other column of the array. In this case, a repeated tile of length-16 wires, such as that bounded by the hatched square 22, is contains 256 cells. Of these, all 256 cells are distinct with respect to the pattern of length-16 wires. The 256 cells form 64 groups of 4 cells each, each group being distinct with respect to the length-8 wires. Again, this places a severe limitation on the placement of hard macros.

The embodiments of the invention which will now be described increase the number of possible placements of a hard macro with respect to the long wires in an FPGA or FPAA. This is achieved by arranging the ends of the long wires in more advantageous positions so that the position along a horizontal wire to which a particular cell is connected is related to the position along a vertical wire to which that cell is connected, in contrast to the arrangements of FIGS. 1 to 4, in which the vertical and horizontal positions are independent. There are two ways in which this can be achieved, which are distinguished by the type of symmetry that relates the horizontal and vertical wires.

To achieve the objective of increasing the flexibility of hard macro placement by having as many equivalent points as possible within a given area, it is clearly necessary to make each wire as similar as possible to its neighbours. This means that the physical relationship of each wire to its neighbours should be as similar as possible, but without having the ends of the wires aligned as in FIGS. 1 to 4.

Figure 5:
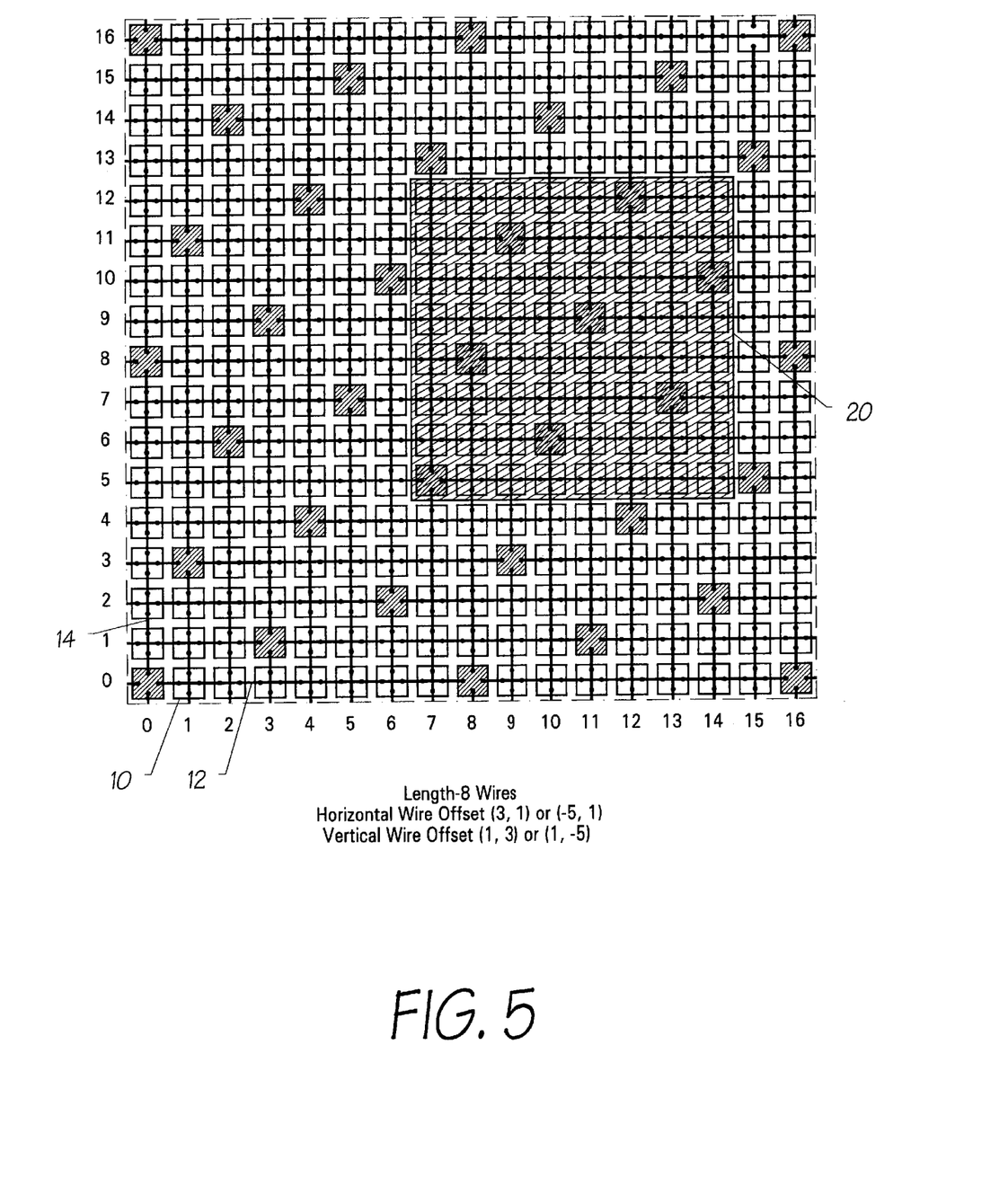
FIGS. 5 to 8 show horizontal and vertical layers of the wiring of four devices according to first to fourth embodiments, respectively, of the invention.

An alternative way for each wire to have the same physical relationship to its neighbours is if each wire is offset from its parallel neighbours by a constant distance D times the cell pitch in the direction of the wire. This is illustrated in FIG. 5 in the case of length-8 wires. The horizontal length-8 wires 12 in adjacent rows are offset from each other by a distance of 3 units. More specifically, in row y+1, the ends of the wires are offset by (3, 1) from the ends of the wires in row y.

However, it is necessary to find a placement of equivalent points that will be equivalent for both the horizontal and vertical wires, in order to build a wiring structure with both horizontal and vertical wires without a reduction in the number of equivalent points. It can be seen from FIG. 5 that to move from the wire-end cell at (0, 0) to the wire-end cell in the next row up requires a movement of 3 to the right and one up to the cell at (3, 1). But also, to move from the wire-end cell at (0, 0) to the wire-end cell in the next column requires a movement of 1 to the right and 3 up to the cell at (1, 3). The exchange of the relative movements horizontally and vertically indicates that the cells at (3, 1) and (1, 3) are equivalent not only with respect to horizontal wires, but also with respect to vertical wires in the same pattern.

As can be seen in FIG. 5, the positions of the wire-end cells, which are shown hatched ///, possess reflective symmetry about both of the 45° diagonals which pass through any of the hatched wire-end cells. However, this mirror imaging is not coincidental. Adjacent horizontal wires are offset from each other by a distance D (=3), so the wire in a row number N in an L×L tile 20 of interest starts at horizontal position N×D. As N is increased, eventually the original series of wire ends will move out of the L×L tile 20 of interest, and be replaced by another series of wire ends offset from the first by L, i.e. one length L wire to the side of the first series. So the horizontal position of the wire end in row N of the L×L tile is given by (N×D) mod L, where mod indicates the modulus operation. Consider the wire-end cell that is D rows up from the bottom. For this cell, N=D. So for this cell to be at the end of a horizontal wire, (N×D) mod L=(D×D) mod L=1. Only values of D and L that satisfy the equation (D×D) mod L=1 result in a set of equivalent points that has reflective symmetry, and so is equivalent for both horizontal and vertical wires.

It is common practice in FPGA design for L to be a power of 2. Although this constraint does not seem to be necessary, if it is accepted, then there seem to be few solutions to the above equation of interest. For L=8, the solutions are D=1, 3, 5 or 7. The solutions D=1 and D=7 correspond to having the wire end points on one of the 45° diagonals. This is a possible arrangement, but has the disadvantage that the resultant layout has a distinct diagonal bias, and that the two wires adjacent to a given cell are at alignments that differ by only one cell, giving limited wiring flexibility. D=3 corresponds to the layout shown in FIG. 5 and D=5 corresponds to its mirror image.

Figure 6:
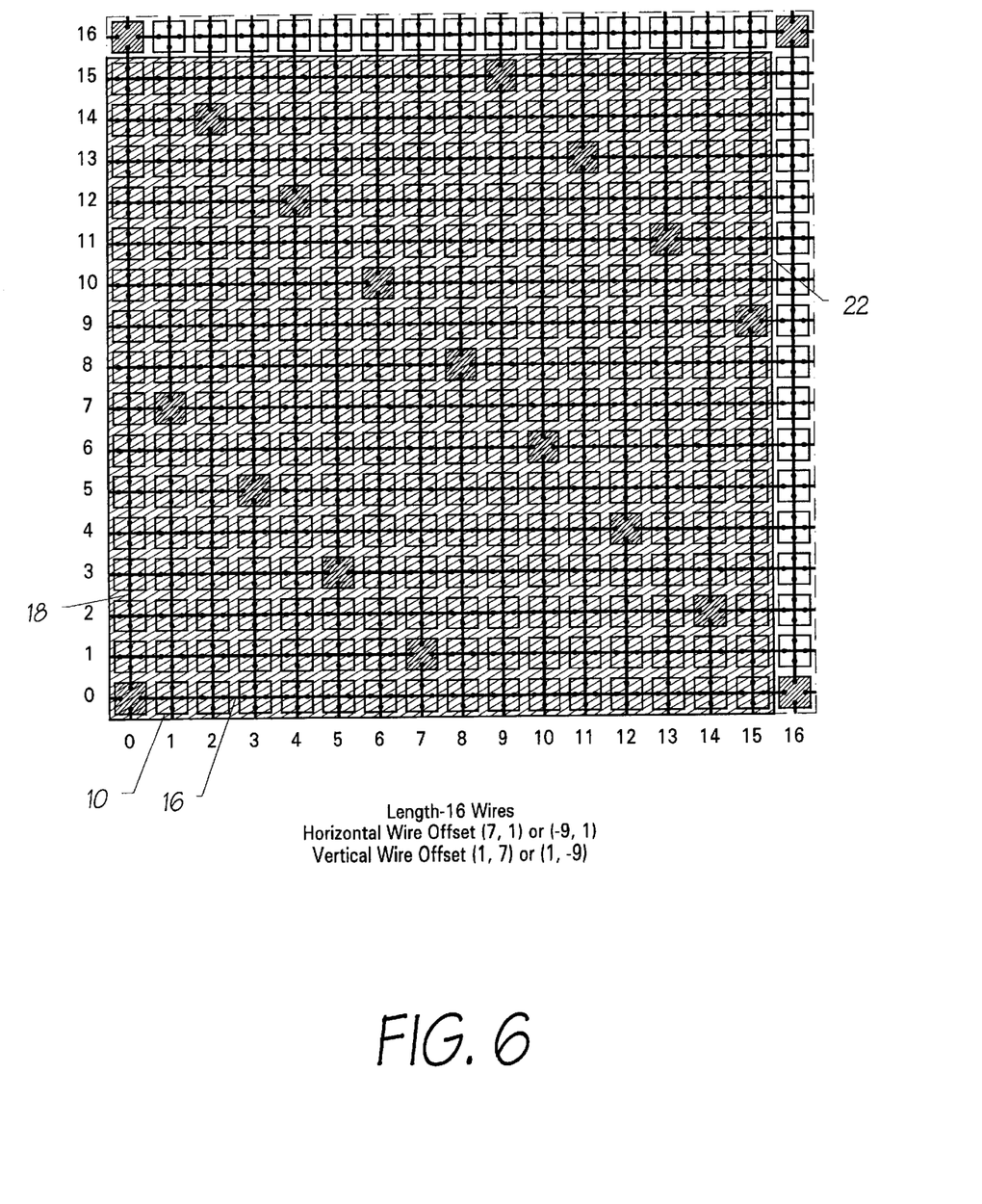

For L=16, D=7 or 9 give valid and useful solutions. FIG. 6 shows the case when D=7 for length-16 horizontal wires 16 and length-16 vertical wires 18.

For L=4, there are no solutions except D=1 or 3, which correspond to the diagonal placement of the endpoints.

It should be noted that although the wire ends were chosen as "equivalent points" in the figures, this is not necessary. Any point could be chosen, and the point chosen for the horizontal wires does not need to be the same as that chosen for the vertical wires. So the vertical wires do not need to be aligned with the horizontal wires so that their end points are at the same points; any relative alignment could be chosen.

Figure 7:
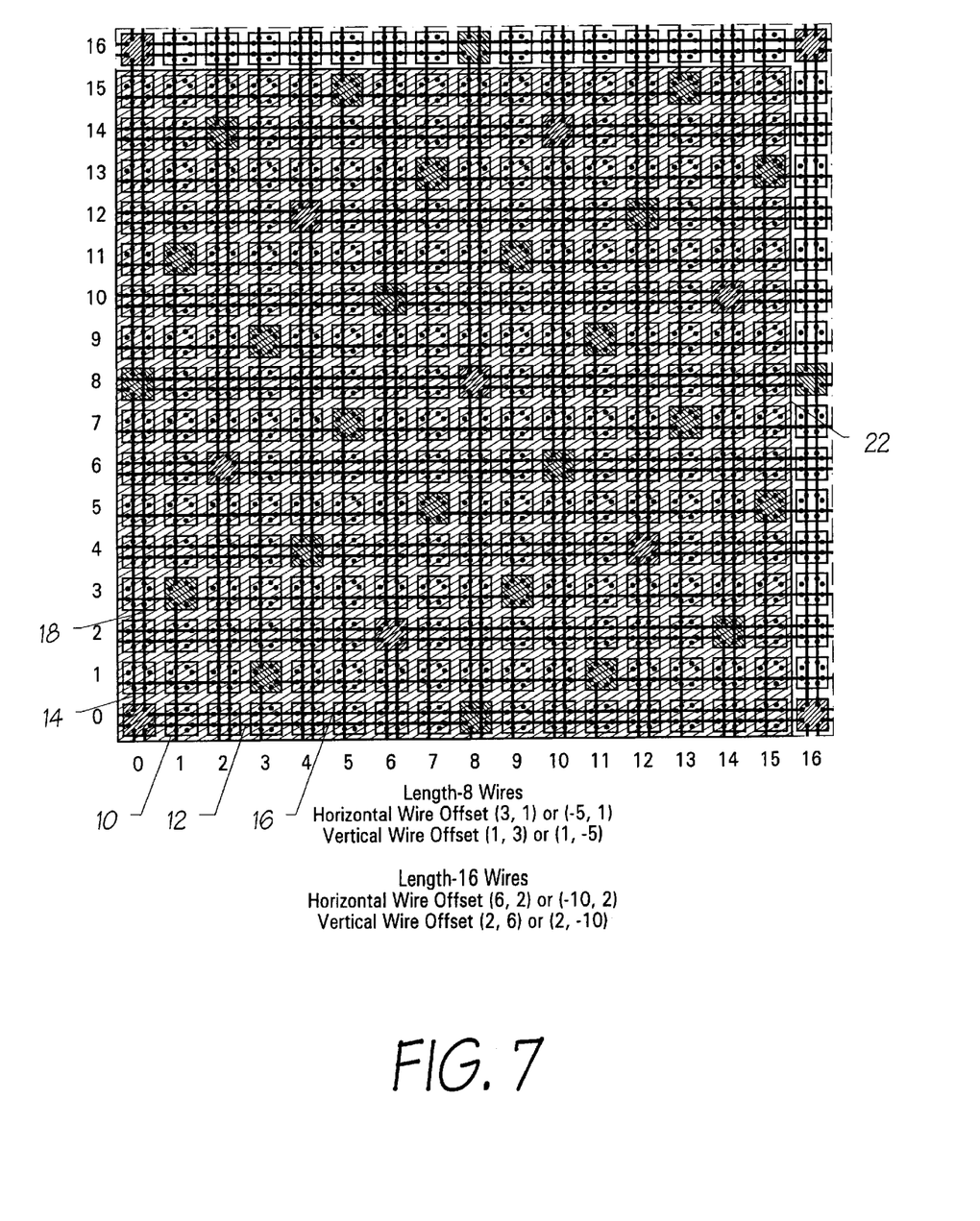

A further issue is that it is not necessary to provide one length L wire per row or column. Either more or less could be provided. One interesting arrangement, as shown in FIG. 7, is to make the frequency of wires be inversely proportional to the wire length. So if length-8 wires 12, 14 are provided for every row and column of cells, then length-16 wires 16, 18 would be provided for alternate rows and alternate columns. Furthermore, length-32 wires could be provided for every fourth row and every fourth column, etc. In that case, the pattern of equivalent points for length-8 wires can be "magnified" to give a pattern for length-16 wires on alternate rows and columns (and length-32 wires on every fourth row and column, etc). This is significant, because it means that all points that are equivalent with respect to wires of one length will also be equivalent with respect to wires of shorter length with the same pattern. Hence just as the number of equivalent points was maintained by s making the sets of equivalent points the same for horizontal and vertical wires, so it is possible to maintain the number of equivalent points with respect to sets of wires of various lengths. As for horizontal and vertical wires, any relative alignment of the wires of different lengths can be chosen. Additional sets of wires of a given length with the same pattern of equivalent points can also be added.

Figure 9:
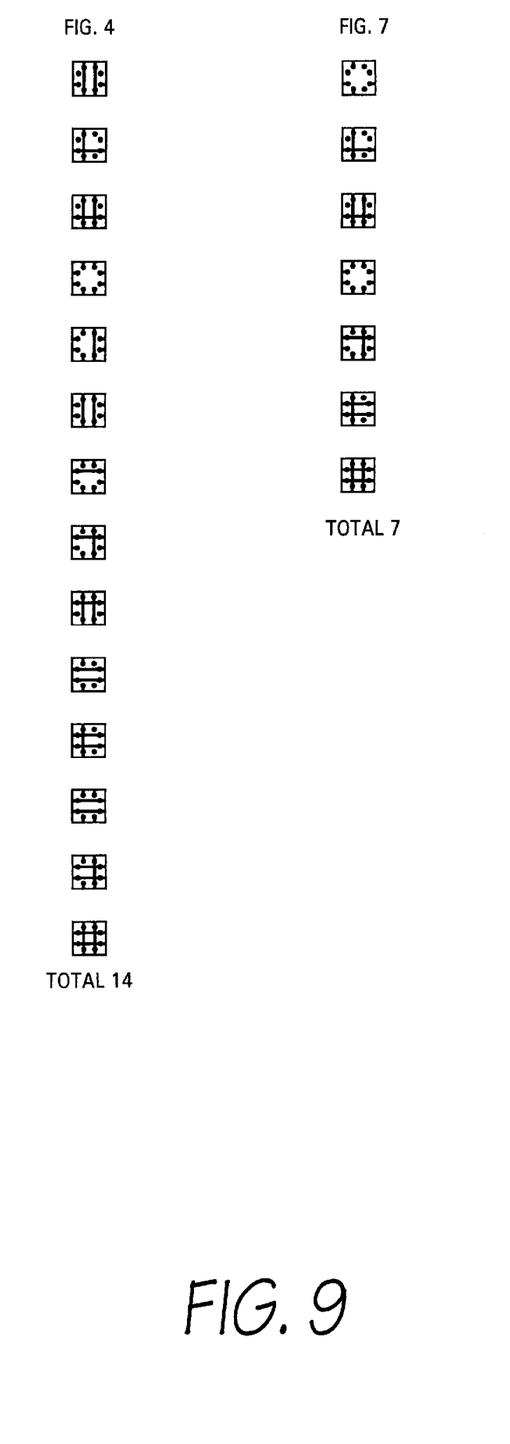
FIG. 9 shows the different types of wiring at a cell in the case of the arrangement of FIG. 4, and for comparison also in the case of the third embodiment of the invention as shown in FIG. 8.

As mentioned above, in the case of the length-8 and length-16 aligned arrangement of FIG. 4, there are 192+16= 208 distinct positions for the cells relative to the wires. By contrast, in the corresponding embodiment of the invention shown in FIG. 7, there are only 16 such distinct positions, which greatly facilitates the placement of hard macros. Furthermore, as shown in FIG. 9, in the case of the FIG. 4 arrangement, there are fourteen different ways in which cells are connected to the wires which cross them. By contrast, in the case of the arrangement of FIG. 7, there are only seven different ways in which cells are connected to the wires which cross them, which provides simplification of the circuit design.

As described above, an important point in maintaining the maximum number of equivalent points in an FPGA array is to ensure that points that are equivalent with respect to one set of wires are also equivalent with respect to other sets of wires as far as possible. For the case of vertical and horizontal wires, this was achieved by making the two sets of wires be reflections of each other about a 45° axis.

Figure 8:
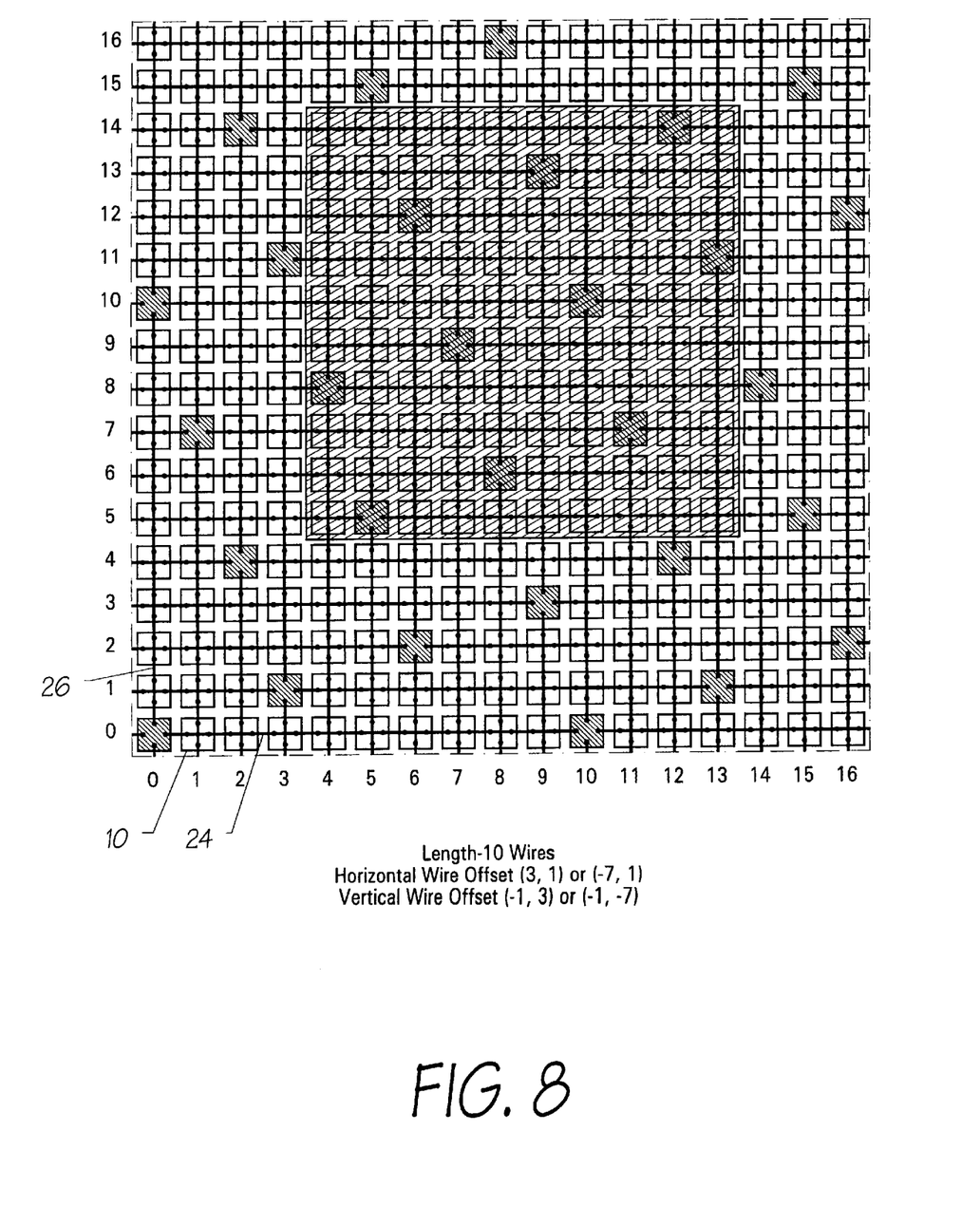

However, it is also possible to achieve the same effect by making the horizontal and vertical wires be rotations of each other about some point. Referring to FIG. 8, vertically adjacent wires are offset horizontally by three cells as in FIG. 5. But in the case of FIG. 8, the horizontal and vertical wires 24,26 have a length of 10 units, so that a wire-end cell (shown hatched \\) three rows above another is one cell to the left of it, rather than being one cell to the right of it as in FIG. 5. It can be seen that this results in a pattern of wire-end cells or equivalent points that has 90° rotational symmetry about any of the wire-end cells, rather than the reflective symmetry of FIGS. 5 to 7.

The equation that expresses this constraint is (D×D) mod L=(−1) mod L=L−1. Unfortunately this equation does not have solutions in which L is a power of 2 except L=2. Hence it is possible to use the rotational symmetry approach to FPGA layout with L>2 only if wire lengths that are not powers of 2 can be considered.

Comparing the arrangements described above:-

In the case of FIG. 4, the horizontal length-8 wires in any row y each extend between cells at:

$$(8i, y) \text{ and } (8(i+1), y) \tag{1}$$

the horizontal length-16 wires in any even row y each extend between cells at:

$$(16i, y) \text{ and } (16(i+1), y) \tag{2}$$

the vertical length-8 wires in any column x each extend between cells at:

$$(x, 8i) \text{ and } (x, 8(i+1)) \tag{3}$$

and the vertical length-16 wires in any even column x each extend between cells at:

$$(x, 16i) \text{ and } (x, 16(i+1)). \tag{4}$$

In the case of FIG. 7, the horizontal length-8 wires in any row y each extend between cells at:

$$(8i+(3y \bmod 8), y) \text{ and } (8(i+1)+(3y \bmod 8), y) \tag{5}$$

the horizontal length-16 wires in any even row y each extend between cells at:

$$(16i+(3y \bmod 16), y) \text{ and } (16(i+1), y) \tag{6}$$

the vertical length-8 wires in any column x each extend between cells at:

$$(x, 8i+(3x \bmod 8)) \text{ and } (x, 8(i+1)+(3x \bmod 8)) \tag{7}$$

and the vertical length-16 wires in any column x each extend between cells at:

$$(x, 16i+(3x \bmod 16)) \text{ and } (x, 16(i+1)+(3x \bmod 16)). \tag{8}$$

In the case of FIG. 8, the horizontal length-10 wires in any row y each extend between cells at:

$$(10i+(3y \bmod 10), y) \text{ and } (10(i+1)+(3y \bmod 10), y) \qquad (9)$$

and the vertical length-10 wires in any column x each extend between cells at:

$$(x, 10i-(3x \bmod 10)) \text{ and } (x, 10(i+1)-(3x \bmod 10)). \qquad (10)$$

It should be noted that the "x" terms in the expressions (1) and (2) above (for the arrangement which is not an embodiment of the invention) are not dependent on y, and the "y" terms in the expressions (3) and (4) above are not dependent on x. By contrast, for the embodiments of the invention, the "x" terms in the expressions (5), (6) and (9) above are dependent on y, and "y" terms in the expressions (7), (8) and (10) above are dependent on x. In other words, with the embodiments of the invention, the horizontal position of a horizontal wire is dictated at least to some extent by its vertical position, and the vertical position of a vertical wire is dictated at least to some extent by its horizontal position.

Having described in detail particular embodiments of the invention, purely by way of example, it will be appreciated that many modifications and developments may be made thereto.

For example, some advantage of the invention may be obtained by making the offset for a particular row dependent upon the row position without being a function (in the strict mathematical sense of the word) of the row position, and/or by making the offset for a particular column dependent upon the column position without being a function of the column position.

Although the embodiments of the invention have been described in relation to a two-dimensional array of the cells 10, the invention is also applicable to three-dimensional arrays.

The invention may be applied to all of the long wiring of an FPGA or FPAA, or only to one or more particular regions of it.

What is claimed is:

1. A programmable logic device, comprising:
    a rectilinear array of logic cells pitched with first and second general cell pitches $P_1$, $P_2$, respectively, in first and second axial directions, respectively, of the array; and
    an array of wires each extending generally in the first direction between a respective pair of the cells which have a pitch of $N_1 \times P_1$, where $N_1$ is an integer greater than one, the wire array having a pitch in the second direction generally equal to $N_2 \times P_2$, where $N_2$ is an integer greater than zero;
    wherein pairs of the wires of the array which are adjacent in the second direction are mutually offset in the first direction.

2. A device as claimed in claim 1, wherein all, or the majority, of the adjacent pairs of the wires are generally evenly offset by a distance $D \times P_1$.

3. A device as claimed in claim 2, wherein $N_1$ is greater than two.

4. A device as claimed in claim 3, wherein $N_1$ is a power-of-two.

5. A device as claimed in claim 4, wherein $N_1$ is greater than four.

6. A device as claimed in claim 5, wherein the value D is greater than one.

7. A device as claimed in claim 1, further including a second array of wires each extending generally in the second direction between a respective pair of the cells which have a pitch of $N_3 \times P_2$, where $N_3$ is an integer greater than one, the second wire array having a pitch in the first direction generally equal to $N_4 \times P_1$, where $N_4$ is an integer greater than zero, and pairs of the wires of the second array which are adjacent in the first direction being mutually offset in the second direction.

8. A device as claimed in claim 7, wherein: $N_1 = N_3$; $N_2 = N_4$; and the values D for the first-mentioned and second arrays are generally equal.

9. A device as claimed in claim 8, wherein $(D^2 - 1) \bmod (N_1/N_2) = 0$.

10. A device as claimed in claim 9, wherein the cells at the ends of the wires possess reflective symmetry about a diagonal of the cell array.

11. A device as claimed in claim 8, wherein $(D^2 + 1) \bmod (N_1/N_2) = 0$.

12. A device as claimed in claim 11, wherein the cells at the ends of the wires possess quarter-turn rotational symmetry.

13. A device as claimed in claim 1, further including a further array of wires each extending generally in the first direction between a respective pair of the cells which have a pitch of $2^M \times N_1 \times P$, where M is an integer greater than zero, the further wire array having a pitch in the second direction generally equal to $2^M \times N_2 \times P_2$, and pairs of the wires of the further wire array which are adjacent in the second direction being mutually offset in the first direction.

14. A programmable logic device, comprising:
    a rectilinear array of logic cells pitched with first and second general cell pitches $P_1$, $P_2$, respectively, in first and second axial directions, respectively, of the array;
    a first array of wires each extending generally in the first direction between a respective pair of the cells which have a pitch of $N_1 \times P_1$, where $N_1$ is an integer s greater than one, the wire array having a pitch in the second direction generally equal to $N_2 \times P_2$, where $N_2$ is an integer greater than zero, wherein pairs of the wires of the array which are adjacent in the second direction are mutually offset in the first direction;
    a second array of wires each extending generally in the second direction between a respective pair of the cells which have a pitch of $N_3 \times P_2$, where $N_3$ is an integer greater than one, the second wire array having a pitch in the first direction generally equal to $N_4 \times P_1$, where $N_4$ is an integer greater than zero, and pairs of the wires of the second array which are adjacent in the first direction being mutually offset in the second direction; and
    a third array of wires each extending generally in the first direction between a respective pair of the cells which have a pitch of $2^M \times N_1 \times P_1$, where M is an integer greater than zero, the third wire array having a pitch in the second direction generally equal to $2^M \times N_2 \times P_2$, and pairs of the wires of the third array which are adjacent in the second direction being mutually offset in the first direction.

15. A device as claimed in claim 14, further including a fourth array of wires each extending generally in the second direction between a respective pair of the cells which have a pitch of $2^M \times N_3 \times P_2$, the fourth wire array having a pitch in the first direction generally equal to $2^M \times N_4 \times P_1$, and pairs of the wires of the fourth array which are adjacent in the first direction being mutually offset in the second direction.

16. A programmable logic device, comprising:
    a rectilinear array of logic cells pitched with first and second general cell pitches $P_1$, $P_2$, respectively, in first and second axial directions, respectively, of the array;
    a first array of wires each extending generally in the first direction between a respective pair of the cells which have a pitch of $N_1 \times P_1$, where $N_1$ is an integer greater than one, the first wire array having a pitch in the second direction generally equal to $N_2 \times P_2$, where $N_2$ is an integer greater than zero; and a second array of wires each extending generally in the second direction between a respective pair of the cells which have a pitch of $N_1 \times P_2$, the second wire array having a pitch in the second direction generally equal to $N_2 \times P_1$;

wherein:

the wires in the first array have offsets in the first direction dependent upon their position in the second direction; and the wires in the second array have offsets in the second direction dependent upon their position in the first direction.

17. A device as claimed in claim 16, wherein the wires in the first array have offsets in the first direction which are a first function of their position in the second direction, and the wires in the second array have offsets in the second direction which are a second function of their position in the first direction.

* * * * *